United States Patent [19]
Du et al.

[11] Patent Number: 6,124,973
[45] Date of Patent: Sep. 26, 2000

[54] DEVICE FOR PROVIDING THE CROSS-SECTION OF THE RADIATION EMITTED BY SEVERAL SOLID-STATE AND/OR SEMICONDUCTOR DIODE LASERS WITH A SPECIFIC GEOMETRY

[75] Inventors: Keming Du; Peter Loosen, both of Aachen, Germany

[73] Assignee: Fraunhofer Gesellschaft Zur Foerderung der Angewandten Forschung E.V., Munich, Germany

[21] Appl. No.: 09/125,534

[22] PCT Filed: Feb. 20, 1997

[86] PCT No.: PCT/EP97/00823

§ 371 Date: Jan. 11, 1999

§ 102(e) Date: Jan. 11, 1999

[87] PCT Pub. No.: WO97/31284

PCT Pub. Date: Aug. 28, 1997

[30] Foreign Application Priority Data

Feb. 23, 1996 [DE] Germany .................. 196 06 859

[51] Int. Cl.[7] ........................................ G02B 27/10
[52] U.S. Cl. ............................ 359/618; 359/627
[58] Field of Search ............................ 359/618, 619, 359/620–622, 625, 627–629, 726; 257/88, 98

[56] References Cited

U.S. PATENT DOCUMENTS

| | | | |
|---|---|---|---|
| 4,701,018 | 10/1987 | Loucks | 359/618 |
| 4,978,197 | 12/1990 | Horikawa | 359/629 |
| 5,629,791 | 5/1997 | Harrigan | 359/223 |
| 5,808,323 | 9/1998 | Spaeth et al. | 257/88 |

*Primary Examiner*—Georgia Epps
*Assistant Examiner*—Jordan M. Schwartz
*Attorney, Agent, or Firm*—Milde, Hoffberg & Macklin, LLP

[57] ABSTRACT

The invention concerns an arrangement for shaping the geometrical cross-section of a radiation field of a plurality of solid and/or semiconductor laser, in particular a plurality of diode laser arrays or field arrangements whose beam-outlet openings extend in a direction lying in the x-y plane and whose ray beam is radiated in the z direction, the x, y and z directions establishing a rectangular co-ordinate system, with an optical structure for generating a defined cross-section for a radiation field. The optical structure comprises reflective elements onto which the radiation of the respective lasers or laser field arrangements is guided and at which the radiation is reflected. The arrangement according to the invention is characterized in that each laser or laser field arrangement both in the x direction and in the y direction; and in that the reflection surfaces of the reflective elements are disposed in planes which are mutually offset and/or tilted such that the radiation portions reflected by the reflection surfaces are mutually offset perpendicular to the radiation diffusion direction with respect to the offset of the radiation outlet surfaces.

19 Claims, 11 Drawing Sheets

DEVICE FOR PROVIDING THE CROSS-SECTION OF THE RADIATION EMITTED BY SEVERAL SOLID-STATE AND/OR SEMICONDUCTOR DIODE LASERS WITH A SPECIFIC GEOMETRY

BACKGROUND OF THE INVENTION

The present invention concerns a device for providing the cross-section of the radiation emitted by several solid-state and/or semiconductor diode lasers and especially by arrays of such lasers, as recited in the preamble to claim 1 with a specific geometry.

Such a device is known from U.S. Pat. No. 4,978,197. Several lasers are distributed in rows, one behind another paralleling the X axis. Viewed as a linear arrangement of sources of radiation extending parallel to the X axis, the individual laser beams strike mirrors mutually displaced paralleling the X axis and associated with them. The individual beams are diverted to the mirrors, forwarded to a polarizing beam divider, and diverted again. The radiation from the second linear arrangement is again reflected onto prismatic mirrors in accordance with the first linear arrangement and forwarded to a deflecting mirror, combining the beams in the beam divider at its semitransparent reflecting surface with the separate radiation components from the first linear arrangement. Producing compound beams out of the components.

Their high efficiency and small size make diode lasers particularly interesting, even though the output of each laser is limited to a few hundred mW. That output can be increased, however, by combining several lasers into an emitter group at the laser's positive-to-negative junction. Such a group can comprise 20 lasers and can output a few watts. The output can be increased even farther by combining several adjacent groups into a strip, typically 10 mm long, at the positive-to-negative junction. Strips of individual diode lasers can output some tens of watts.

Figure 2:
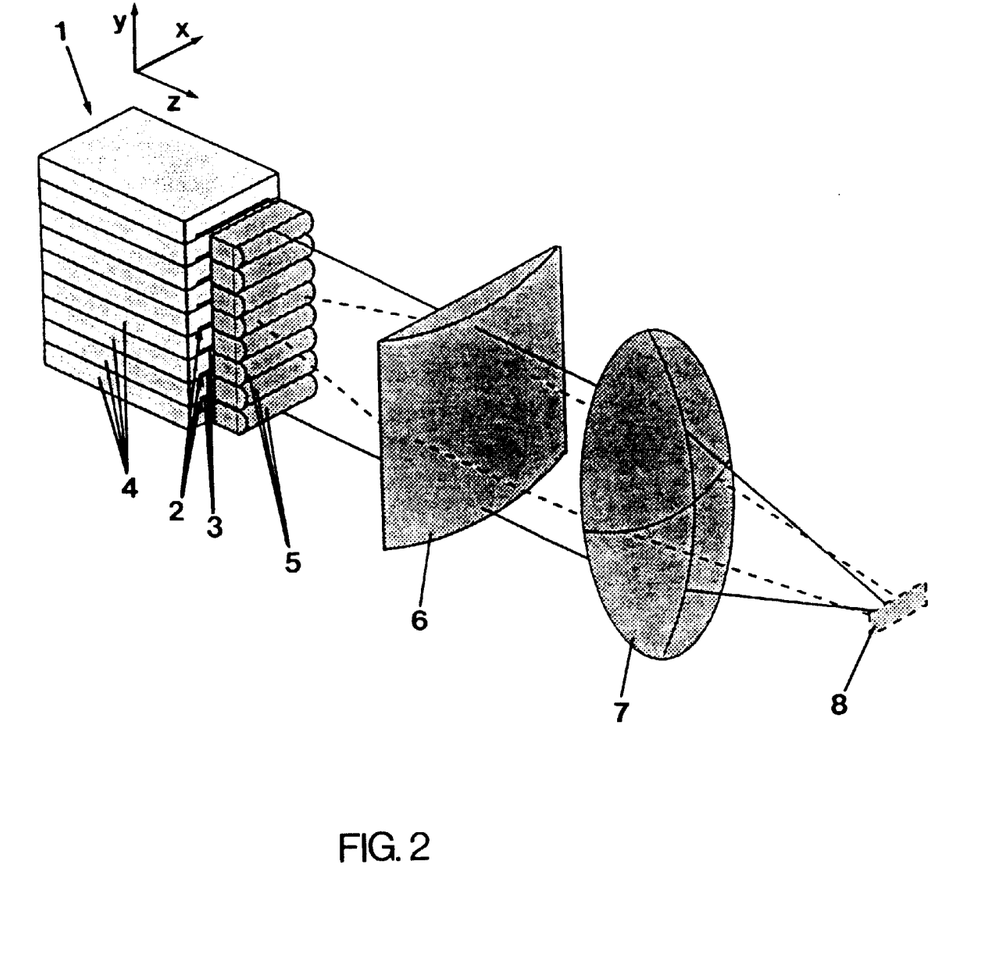
FIG. 2 is a schematic illustration showing the basic structure of a diode-laser array comprising several strips.

Still, outputs of more than a few hundred watts are necessary for some applications, in materials processing for example, where several strips need to be stacked parallel to the Y axis into "arrays". Such an array is schematically illustrated in FIG. 2, which will be discussed hereinafter in detail in the specification.

A serious problem that accompanies the extension of diode-laser outputs is that of the severe heat that occurs. The heat must be eliminated by providing the diodes with heat sinks. On the other hand, massive heat sinks, large enough cooling devices in other words, prevent the diodes or their radiation-emitting surfaces from being stacked close enough together to achieve the desired outputs. It is accordingly conventional to use thin slabs, typically 1 to 1.5 mm thick, for the heat sinks. Such thin slabs, however, not only do not absorb enough heat but are also not very thermally or mechanically stable, and produce considerable errors. The beam direction cannot be well enough defined.

Another consequence of thin heat sinks is the need to adhere to narrow tolerances. Even slight deviations from tolerance will lead to errors in directing the reflected beam that are very difficult to correct with downstream optical devices.

Still another problem is how to seal the stacked strips and thin heat sinks from the water employed as a coolant while simultaneously maintaining the supply of electrical power and without detriment to reflecting the radiation arriving from the individual diodes.

Finally, when an individual strip fails and a whole array has to be dismantled to allow access to it, the entire downstream optical system must be readjusted.

The aforesaid drawbacks, especially those associated with conventional arrays, make the components impractical for specific applications, fiber-optical connections for example, where the divergence must be collimated in the Y direction. Some state-of-the-art approaches employ complicated and expensive optics to align the rays from individual strips or arrays. Such systems, however, result in fields of radiation with intensities that cannot be distributed accurately perpendicular to the angle of propagation.

SUMMARY OF THE INVENTION

With the aforesaid state of the art as a point of departure, then, the principal object of the present invention is to provide an improved device of the aforesaid type for producing the cross-section of a field of illumination with a specific geometry. This device will feature simple and cost-effective means of forming and/or collimating the radiation from strips or arrays of individual diode lasers into fields of a desired geometry and light-density distribution. It will also be possible to stack the strips very tight while ensuring the requisite thermal and mechanical stability.

This object well as other objects which will become apparent from the discussion that follows, are achieved in accordance with the present invention in a device of the aforesaid type by displacing each laser or array in relation to its neighboring laser or array parallel to the X and Y axes and in that the reflective surfaces of the reflectors are disposed in planes displaced and/or tilted such that the radiation components they reflect will be mutually displaced perpendicular to the propagated radiation (paralleling the Z axis) in relation to the displacement of the radiation-emitting surfaces. The particular mutual displacement of adjacent lasers or arrays will save enough space to allow them to be separated, and the extra space can be exploited to accommodate heat sinks with the lasers or strips mounted on them. The lasers or strips can be displaced in two mutually perpendicular directions that do not coincide with the direction the radiation from the lasers or strips departs in. The rays are then combined by reflectors displaced such that the cross-section of each beam can be formed or even superimposed to create a field.

As will be specified hereinafter, the radiation from the lasers or strips is collimated, specifically in the "fast" direction, parallel to the Y-axis and accordingly perpendicular to the laser's positive-to-negative junction before arriving at the reflecting surfaces.

Another advantage of the present invention is that the radiating surfaces of the lasers or strips can be in the same plane, making them easier to adjust in relation to the supply of power and, in the event it is employed, to that of water. The device in accordance with the present invention will in itself ensure well-defined displacement on the part of the lasers or strips, with the radiation-emitting surfaces arranged like stairs for example, especially as viewed toward the windows, and with the displaced radiation components united again by the reflectors. This well-defined stairway-like displacement ensures that the separate radiation components can be combined well defined or into a well defined field along the plane of radiation, with only one reflector assigned to each beam, meaning that only a minimum of optics will be needed and that losses can be kept very low.

It will be evident that displacing the individual diodes or strips in this way will leave them freely accessible from above and below and that there will be no limit to the expansion of the heat sinks because they will have the whole space at their disposal. The heat sinks will, however, also be able to expand horizontally toward each diode.

Still another advantage of the present invention is that the device's output can, due to the stairway arrangement, basically be increased by adding more diodes and by using longer strips, without departing from the essential principle. Such a device can for example be constructed of modules with diodes mounted on heat sinks at two or more levels. This same approach can be implemented with the reflectors that reflect each radiation component. Such reflectors can be stairway-like modules with mirrored surfaces.

The device in accordance with the present invention will be very stable mechanically and thermally if the displacement is attained by a support with several stairway-like diodes or strips mounted on it and with enough heat capacity to promote cooling. These features are not incompatible but mutually augmenting in that the large support will also help to increase mechanical stability.

If the support's tolerances are too great to mount the diodes on it precisely, either they or the downstream and subordinate reflectors can, due to the easy accessibility ensured by the staircase approach, be positioned after they have been mounted. Errors in alignment like those that occur at the state of the art will not occur in accordance with the present invention because the diodes are not mounted one directly on top of another. Such adjustments are in fact impossible at the state of the art. The diodes are just not accessible. It is on the other hand easily possible in accordance with the present invention, due to the availability of each strip. Thus, when individual diodes or strips fail, only the malfunctioning ones will need to be removed, along if the case may be with the associated collimation optics. The replacements can then be adjusted separately, drastically reducing the expense of maintenance in comparison to that at the state of the art.

The diodes should be arrayed or displaced in sequence, in the form, that is, of a stairway with a constant rise. To compensate for differences in the distances the radiation must travel to a prescribed plane of emergence in accordance with a particular reflective surface and to match the various distances one to another. The reflective surfaces can be positioned at different distances from their associated radiation-emitting openings. Such a variation in displacement will compensate for differences in distance and match the distances one to another.

Another preferred means of compensating for and matching the differences in distance is to provide another reflective component next to the first, associated with a particular component of the radiation from a particular diode, and displaced from the first such that the various distances will match when the various components of the radiation are combined. The distances to the various planes of emergence will accordingly all be equal. For a simple and easy-to-adjust array, all the displacements and increments of distance should, as heretofore mentioned, be equal.

Like the supports employed to position the individual diodes, strips, or arrays, the reflective surfaces of the reflective components can constitute a stairway-like mirror. The elevated surfaces of the supports will accordingly be reflected onto the elevated surfaces of the reflective components. The result is a prescribed arrangement of the adjacent and mutually displaced mirrored surfaces with high mechanical stability. The reflective surfaces will preferably be flat, especially if the particular radiation components are parallel beams and do not need to be further focused or dispersed.

The diodes or arrays can also be mutually displaced parallel to the Z axis, in the direction, that is, traveled by the departing radiation, in order to match the aforesaid different distances one to another. Here again, all the displacements and increments of distance should for simplicity's sake be equal.

Again, the mutual displacement of the individual diodes or arrays over the X-Y plane, which is normal to the radiation's plane of propagation, is intended to ensure that the arrays are far enough apart to displace the beams leaving the diodes or arrays, whereas the displacement parallel to the Z axis, in the direction the radiation departs in, that is, is intended to compensate for differences in the distance to the plane of emergence or processing.

The individual diodes or arrays should, as will be evident from the foregoing, be disposed paralleling the longitudinal axis of the individual stairs of the stairway-like supports employed to position them such that the axis of the radiation they emit will parallel the stairs. Such supports will, if the stairs are long enough, allow application-specific positioning and adjustment of the individual diodes and arrays paralleling the Z axis, in the direction the radiation departs in, that is. The adjustment can accordingly affect the distances.

Since the device in accordance with the present invention makes it possible as hereintofore mentioned to shape and combine radiation components arriving from several diodes or arrays well defined, it will also be possible to feed the radiation precisely into a light guide or series or field of light guides downstream of the reflective components and accordingly forward it to a materials-processing site as will be hereinafter specified with reference to various embodiments by way of example.

Another means preferably employed in conjunction with the approached hereintofore described is to combine the outputs of several diodes or arrays by polarization or by the addition of wavelengths. The advantage of this approach, when employed in conjunction with positioning the diodes and arrays in accordance with the present invention as hereintofore described, is that the output can, viewing the radiation-emitting surface from above and given that the radiation components are combined by appropriate displacement of the downstream reflective components and combining the outputs by polarization or wavelength addition, be increased without increasing the cross-section of the radiation or decreasing its quality.

Although the foregoing description has been confined to diode lasers, it also applies to any preferred embodiments that employ lasers. It should however, also be understood as relating to embodiments that depend on other types of solid-state lasers.

For a full understanding of the present invention, reference should now be made to the following detailed description of the preferred embodiments of the invention as illustrated in the accompanying drawings.

BRIEF DESCRIPTION OF THE DRAWINGS

FIGS. 4A and 4B illustrate a third embodiment wherein the diode strips are mounted on a support displaced along the direction the radiation departs in.

DESCRIPTION OF THE PREFERRED EMBODIMENTS

The device in accordance with the present invention depicted in the figures is of type the employed as described in the literature for forming and forwarding the radiation emitted by diode-laser arrays. The various embodiments and versions specified hereinafter, however, can as will be evident also be employed with solid-state lasers.

FIG. 2 illustrates a conventional diode-laser array along with conventional means of collimating its radiation.

Conventional array 1 comprises a stack of several strips 2 of diode lasers. Each individual strip 2 in turn consists of a linear series of diode lasers with their radiation-emitting openings 3 in a straight line and paralleling the same plane X-Y as the strips. Due to the geometry of the active medium employed in such diodes, the radiation usually departs from openings 3 in the form of an elliptical cone with the major axis of the ellipse perpendicular to the positive-to-negative junction, in the fast direction and paralleling the Y axis in FIG. 2, that is. The typical angle of divergence in this direction is 90°, whereas that associated with the minor axis is typically 10°. Strips of this genus are usually approximately 10 mm long paralleling the X axis. Such strips will generally output a few tens of watts. Up to 20 individual diodes are usually linearly combined into such a strip paralleling the X axis. As will be evident from FIG. 2, a heat sink 4 is associated with each strip. The heat sinks, when it is attempted to keep them thin paralleling the Y axis, are typically 1 to 1.5 mm thick.

To collimate the radiation emitted by strips 2 in the fast direction (paralleling the Y axis) a micro-optical component in the form of a miniature cylindrical lens 5 is associated with each strip 2. A larger cylindrical lens 6 is positioned downstream in the direction traveled by the radiation, paralleling the Z axis in FIG. 2, to collimate in the "slow" direction all the radiation components from strips 2 into an essentially parallel beam. This beam is in turn focused by a convex lens 7 into a field 8 of illumination. Such a field will typically measure approximately 0.8 by 3–10 mm$^2$. Although, as will be evident from FIG. 2, several such strips can be stacked together quite tight, the effectiveness of such an array will, as hereintofore mentioned, be limited by the thermal instability of its heat sinks 4.

To increase the cooling and the mechanical stability of such a stack without actually introducing a coolant, each heat sink 4 must be fairly thick paralleling the Y axis. This means that the individual strips 2 must be separated paralleling the Y axis, so that fewer can be packed into the stack and the maximal output density will be lower.

Figure 1:
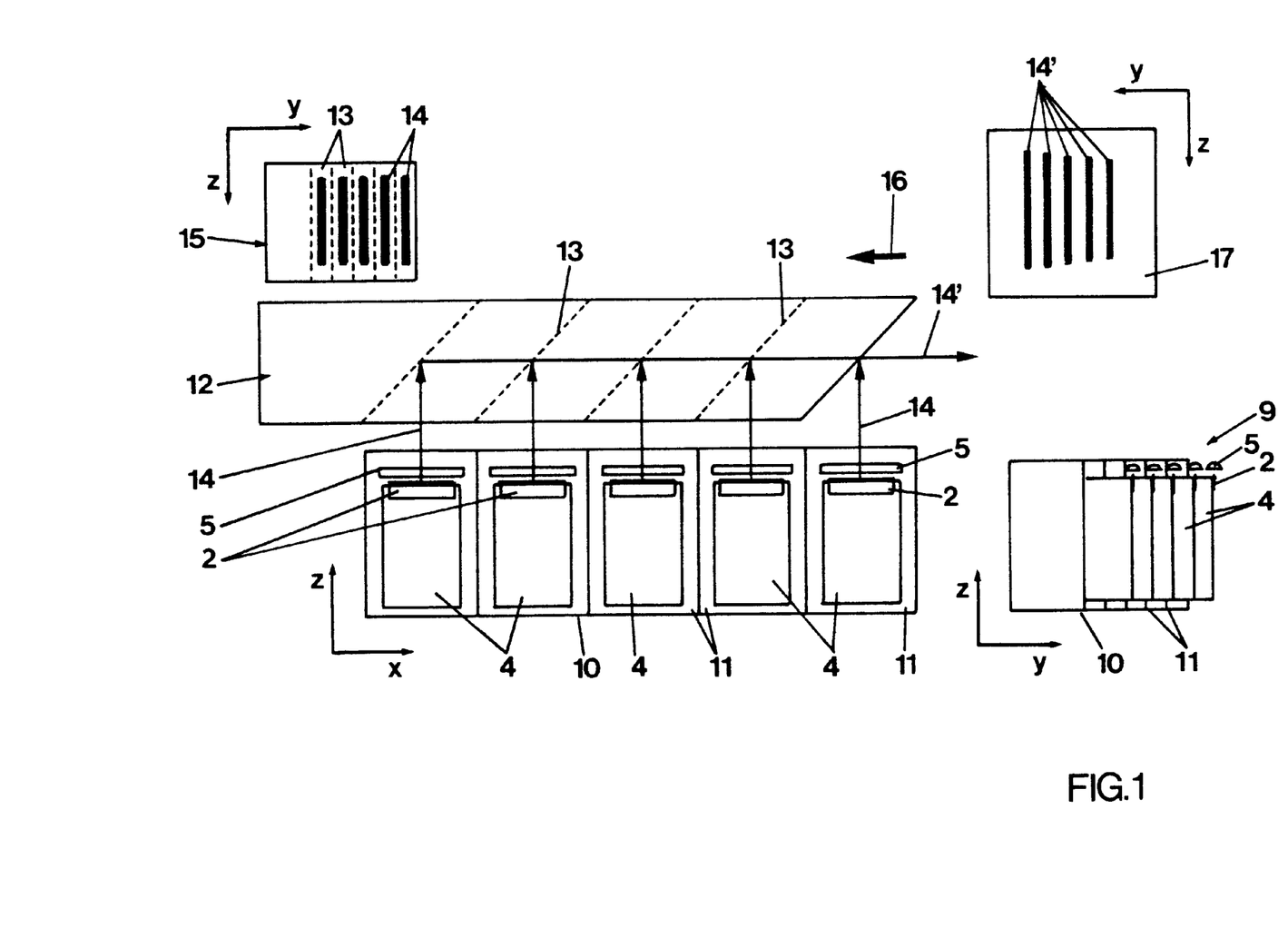
FIG. 1 is a schematic illustration of one embodiment of a device in accordance with the present invention.

The device in accordance with the present invention that will now be specified in principle with reference to the embodiment illustrated in FIG. 1 eliminates this drawback in that the individual strips 2 are not stacked, but positioned mutually adjacent paralleling the X axis (as viewed from above) and mutually displaced paralleling the Y axis as will be evident from side view 9. The result is a stairway-like displacement. The individual strips 2 and their associated heat sinks 4 are secured in this arrangement by a stairway-like support or holder 10 comprising one or more parts. The individual supporting surfaces 11 of support 10 are parallel. The result is a well-defined displacement that, in the embodiment illustrated in FIG. 1, increases constantly from the strip 2 farthest to the left to the strip 2 farthest to the right. It will also be evident that each individual strip 2 will, along with its associated heat sink 4, freely accessible for adjustment. Furthermore, if one strip 2 fails or malfunctions, it can easily be replaced without interfering with the others in any way.

The components 14 of the radiation emitted by the individual strips 2 are reflected by the reflective surfaces 13, represented by the discontinuous lines, of an also stairway-like mirror 12 and accordingly deflected, all in the same direction in the form of outgoing radiation 14'. The angle of deflection in this particular embodiment is 90° although other angles are also possible in accordance with the present invention. It will be evident that reflective surfaces 13 can be oriented with respect to radiation components 14 in any way convenient for attaining the object of the present invention, It will also be evident from FIG. 1 that the radiation leaving each strip 2 will be collimated by a specific miniature cylindrical lens 5 comparable to those represented in FIG. 2. The rise of each stair, the displacement paralleling the Y axis, that is, of each supporting surface 11 on support 10 and accordingly of each strip 2, matches the level of the collimated radiation paralleling the Y axis. The same is true of the rise of each reflective surface 13 of mirror 12, meaning that the mutual displacement between each stair equals the level of the collimated radiation reaching the surface. This displacement will be evident in the top view 15 in FIG. 1 of the stairway-like mirror 12 as seen along direction 16, paralleling the X axis, that is. Outgoing radiation 14' will be evident at level 17 of emergence. The differences in the paths traveled by the radiation to level 17 of emergence and the unillustrated divergences in the slow direction mean that the varying outgoing radiation 14' from each strip 2 will extend a differ distance paralleling the Z axis. These differences are compensated by appropriate optical means. The particular reflective surfaces 13 can for example be slightly concave or convex to diverge or collimate different components of the radiation.

The X, Y, and X coordinates comprise as hereintofore mentioned a rectangular coordinate system.

Figure 10A:
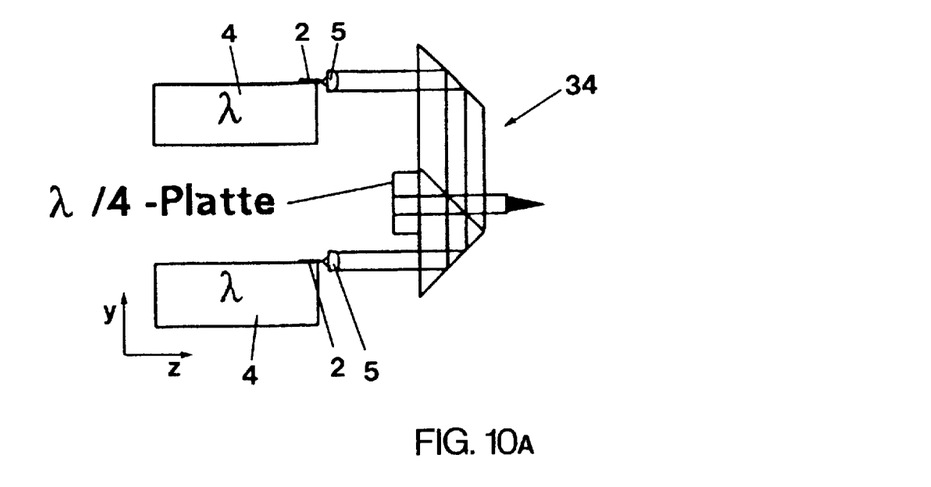
FIG. 10A illustrates a fourth embodiment of the present invention with, instead of a single strip on each stair, two diode lasers stacked parallel to the Y axis and connected by a polarizing component.
Figure 10B:
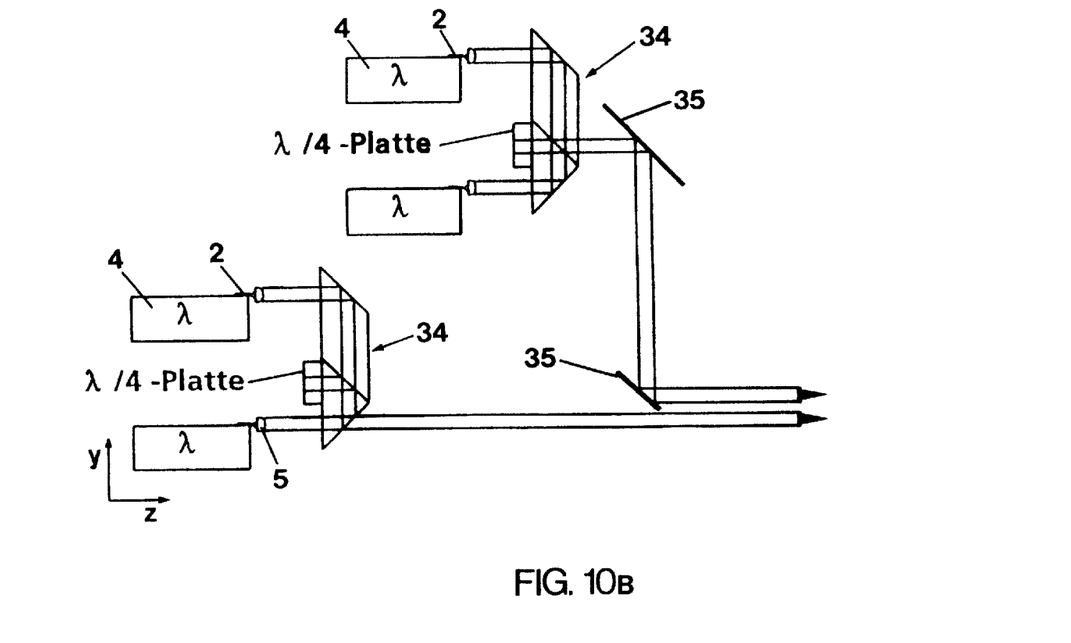
FIG. 10B illustrates two embodiments similar to the embodiment illustrated in FIG. 10A displaced paralleling the X and Y axes and mounted on a stairway-like support, whereby the radiation components are combined by dichroic mirrors.
Figure 10C:
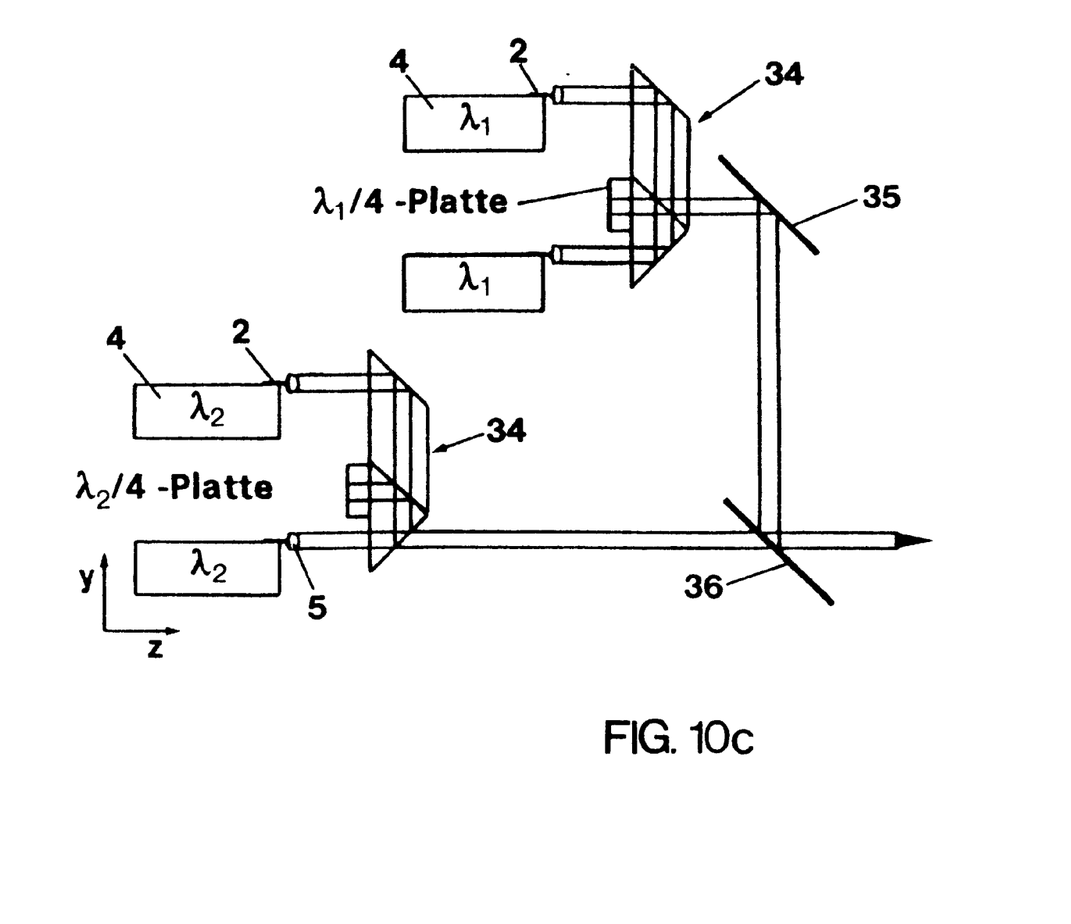
FIG. 10C, illustrates an embodiment similar to those illustrated in FIGS. 10A and 10B.

Small combinations of two or even three rows of individual diode lasers provided with heat sinks extending above and below them, paralleling the Y axis, that is can be employed instead of strips 2. The radiation from such rows is also preferably combined as illustrated in FIG. 10 and specified hereinafter.

Figure 3:
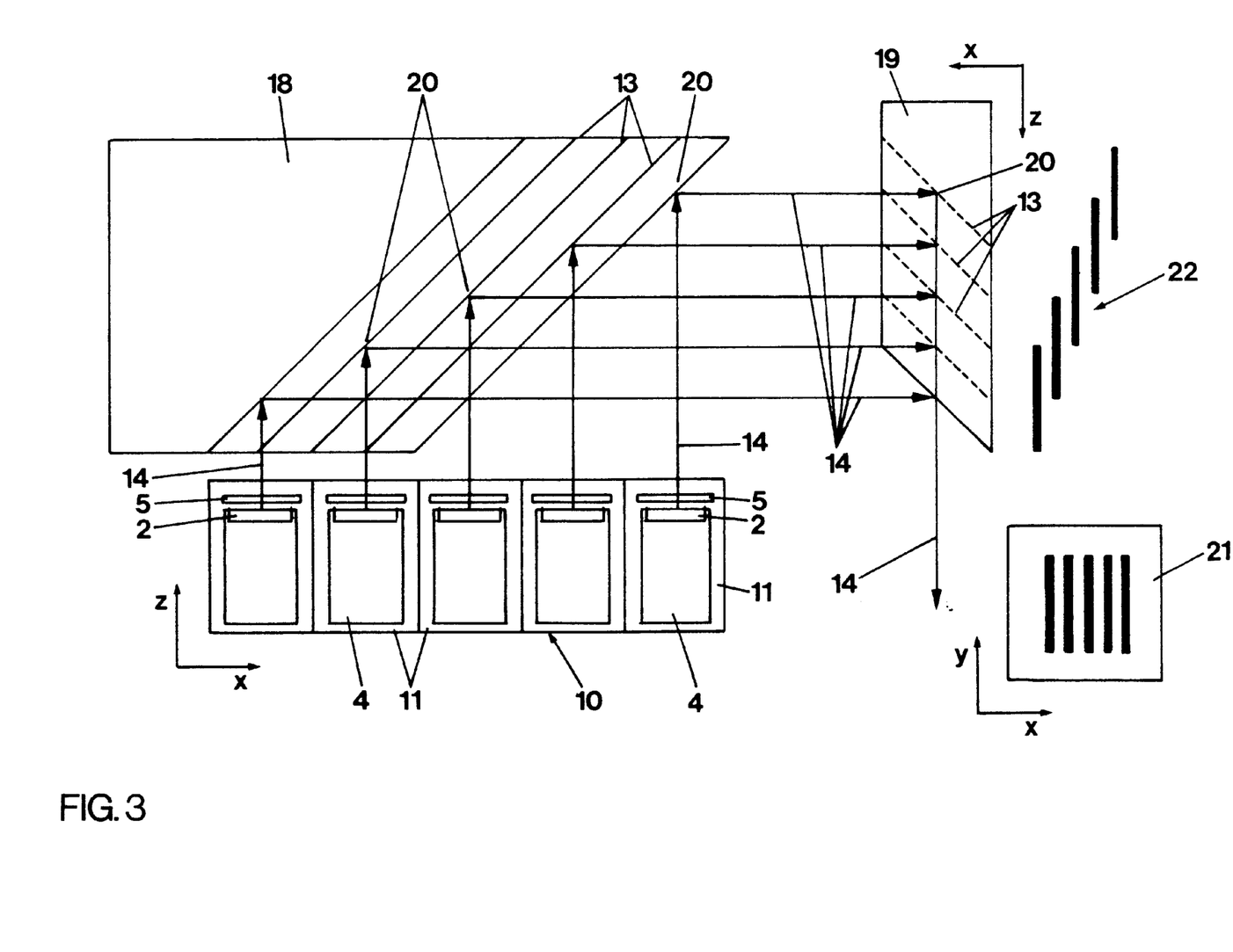
FIG. 3 is a schematic illustration of another embodiment of the present invention wherein in contrast to the first embodiment the distances traveled by the radiation components from the individual strips are adapted to a plane of emergence.

To counteract the differences in the paths mentioned with reference to FIG. 1, the embodiment illustrated in FIG. 3 employs two stairway-like mirrors 18 and 19, with the radiation components 14 deriving from strips 2 reflected by each. The various points or areas 20 of impact on reflective surfaces 13 ensure that all the paths are combined into a single path at a surface 21 of emergence downstream of mirror equal in length.

Since individual radiation components 14 strike the reflective surfaces 13 of stairway-like mirror 18, and radiation components 14' those of stairway-like mirror 19, at an angle of 45°, the radiation will be deflected at an angle of 90°. In other words, the individual strips 2 are disposed such that, as viewed paralleling the Y axis, those farthest to the left in FIG. 3 are at the highest level of stairway-like support 10, whereas those farthest to the right are at the lowest. Each reflective surface 13 of mirror 18 is accordingly at a lower level than its neighbor to the left paralleling the Y axis and as viewed paralleling the X axis, whereas the reflective surfaces 13 of mirror 19 are increasingly higher. As will be evident from radiation cross-section 22, components 14' will strike the reflective surfaces 13 of mirror 19 mutually displaced, and will then be combined by the mirror's appropriately tilted reflective surfaces 13, downstream of the mirror and paralleling the Y axis, into the area of illumination represented on flat surface 21 of emergence. The differences between the distances traveled by each radiation component in arriving at surface 21 of emergence represented in FIG. 3 can be increased or decreased by varying their angle of incidence. The angles and positions of the individual reflective surfaces can be separately adjusted to ensure that the components arriving from the various strips 2 are parallel and free of displacement.

Figure 4A:
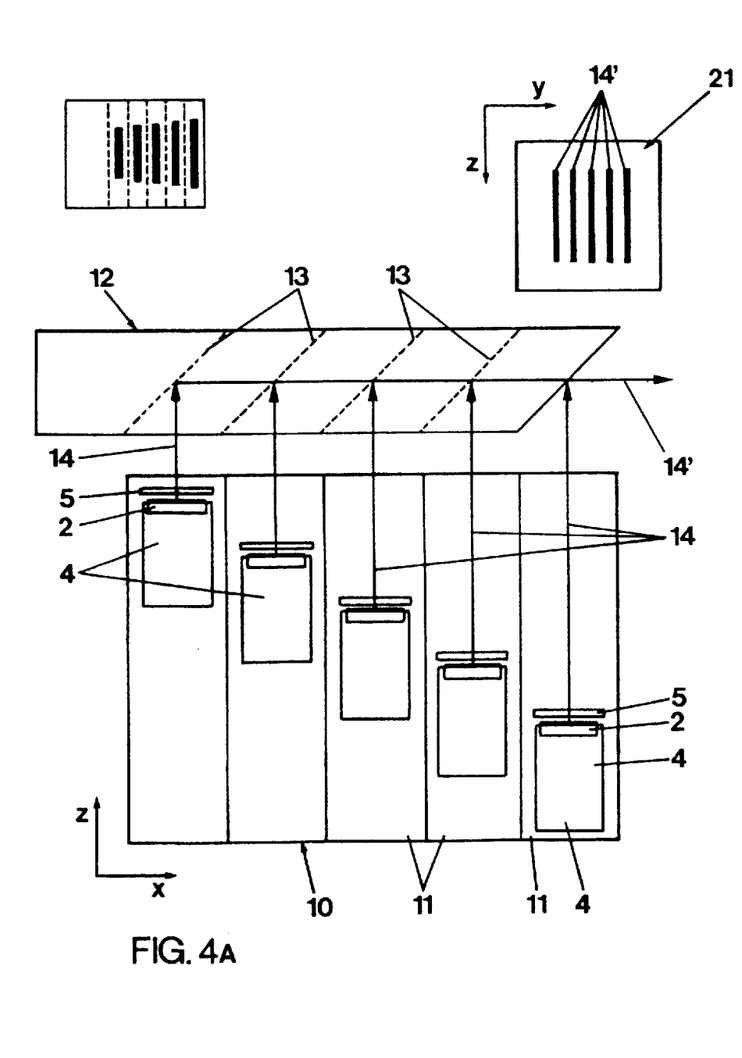
Figure 4B:
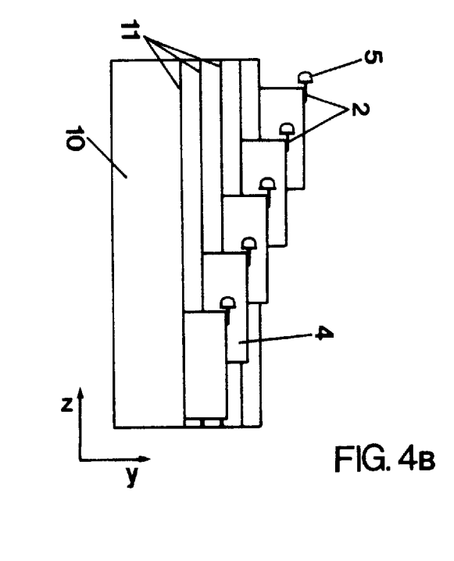

FIG. 4 illustrates a third embodiment of the present invention. The laser-diode strips are again mounted on a stairway-like support 10 and the individual upper surfaces 25 of the stairs parallel the X-Z plane and are at different levels, as will be particularly evident from FIG. 4B, a view from direction IVB in FIG. 4A. In other words, the individual strips 2 are disposed with their heat sinks 4 at the same levels paralleling the Y axis as upper surfaces 25 as well as being mutually displaced paralleling the Z axis, such that all the optical paths traveled by the radiation components on their way to surface 21 of emergence will be the same. The stair rise, the distance paralleling the Y axis between two adjacent horizontal upper surfaces 25, that is, here again equals the level of the collimated radiation.

Radiation components 14 will strike a stairway-like mirror with rises represented by reflective surfaces 13 that reflect the components as outgoing radiation 14'. The reflective surfaces 13 are again mutually equally displaced by a distance that equals that between strips 2. The positions of the strips and the reflective surfaces of stairway-like mirror 12 are coordinated to ensure that all the components will be precisely one above another in the fast direction as specified with reference to surface 21 of emergence.

Figure 5:
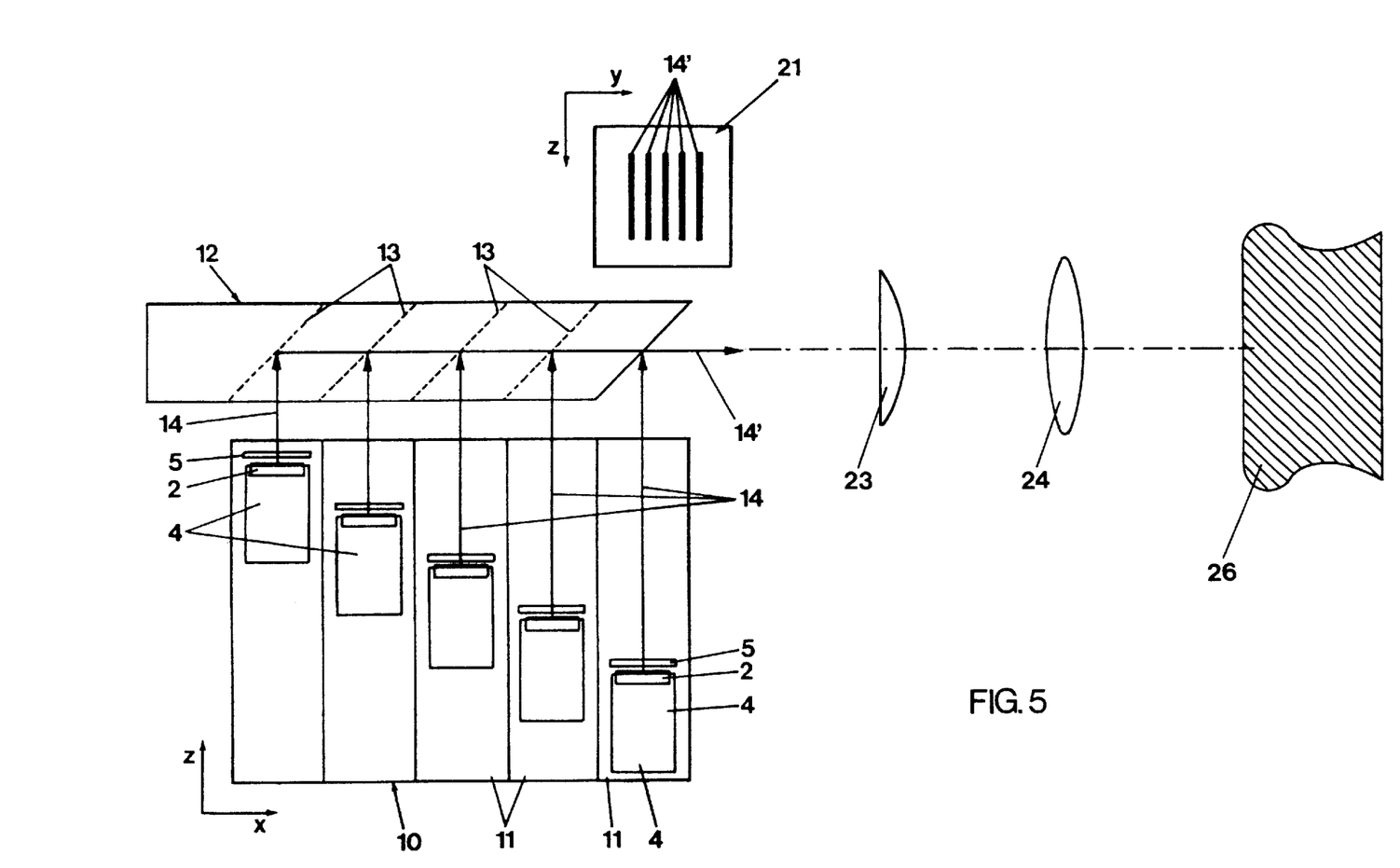
FIG. 5 illustrates a version of the third embodiment that can be employed for example to pump up solid-state lasers or, in conjunction with an appropriate downstream optical system, to process a material.

The stacking specified with reference to FIGS. 4A and 4B can be directly employed for example to pump solid-state lasers. The area of illumination on the surface 21 of emergence in FIG. 4 can be further and more precisely shaped to the specific application, for fiber-optical connections for example, by a downstream optical system. FIG. 5 shows one example of such a system as applied to a version of the present invention like that illustrated in FIG. 4A. Here, the radiation is collimated in the vicinity of surface 21 of emergence by a cylindrical lens 23. The resulting beam is then focused by a downstream spherical lens 24 that aligns the components arriving from the various strips 2 on the material 26 being processed. The advantage of combining the various component as represented in FIG. 5 is that the radiation can be combined with no loss of quality, ensuring maximal output density at the focal point.

Figure 6:
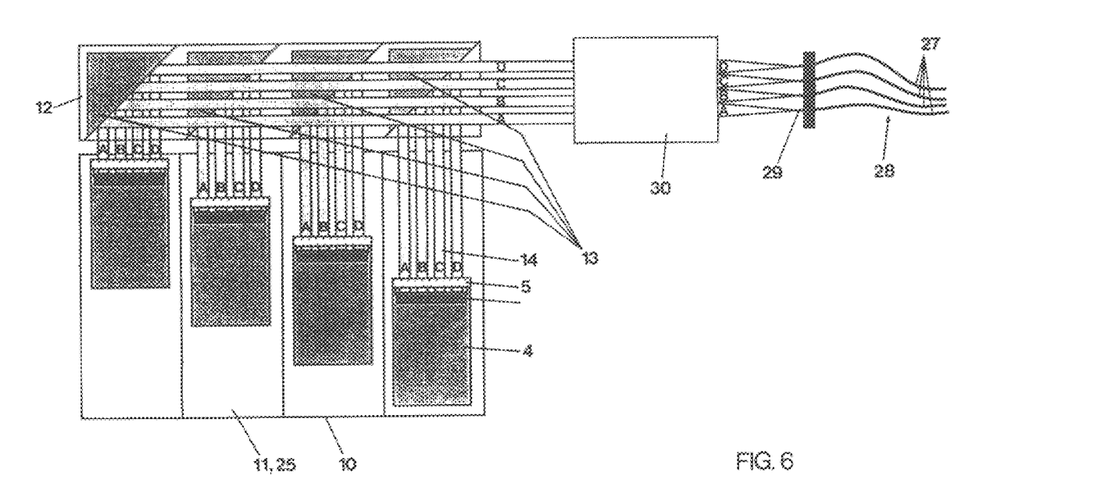
FIG. 6 illustrates another version of the third embodiment wherein the radiation components are separated and forwarded to an array of optical fibers to facilitate transmission.

In many applications a flexible optical path is of advantage. This can be done with the sheaf 28 of round or rectangular optical fibers 27 illustrated in FIG. 6. The radiation leaving strips 2 in this system as well is first collimated by a cylindrical lens 23 and then focused by a spherical lens 24, creating adjacent focal points equal in number to the number of laser groups. Sheaf 28 of optical fibers 27 is positioned to ensure that their intake faces 29 will be at the focal points. A system like that illustrated in FIG. 6 and with as many fibers 27 as focal points is preferable because a component arriving from a specific strip 2 can always be introduced into a specific fiber. The radiation from strips 2 can for this purpose be divided into four groups or channels A, B, C, and D and reassembled. The advantage is that the radiation arriving over a specific channel or channels can be blocked out for specific applications, and the rest delivered to specific points of the area of illumination, whereafter they can also be recombined into groups.

Figure 7:
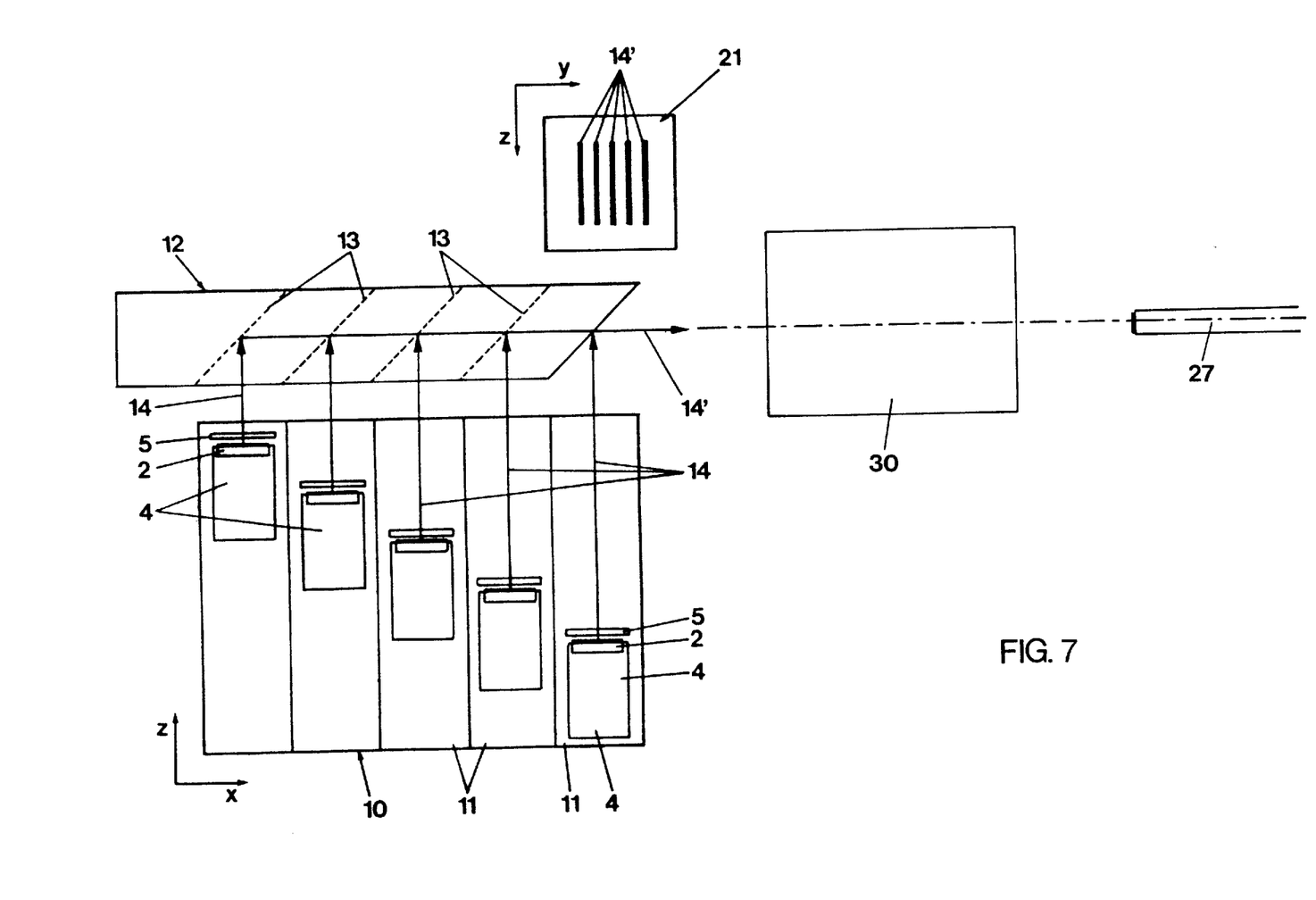
FIG. 7 illustrates a third version of the third embodiment similar to the version illustrated in FIG. 6 except that the radiation components are forwarded to a single fiber or focused directly on the work.

The system in accordance with the present invention can also be employed to introduce a specific radiation component 14' into a specific optical fiber 27 as illustrated in FIG. 7. Such focusing requires a system 30 of additional stairway-like mirrors for example to shape and focus the radiation.

Figure 8:
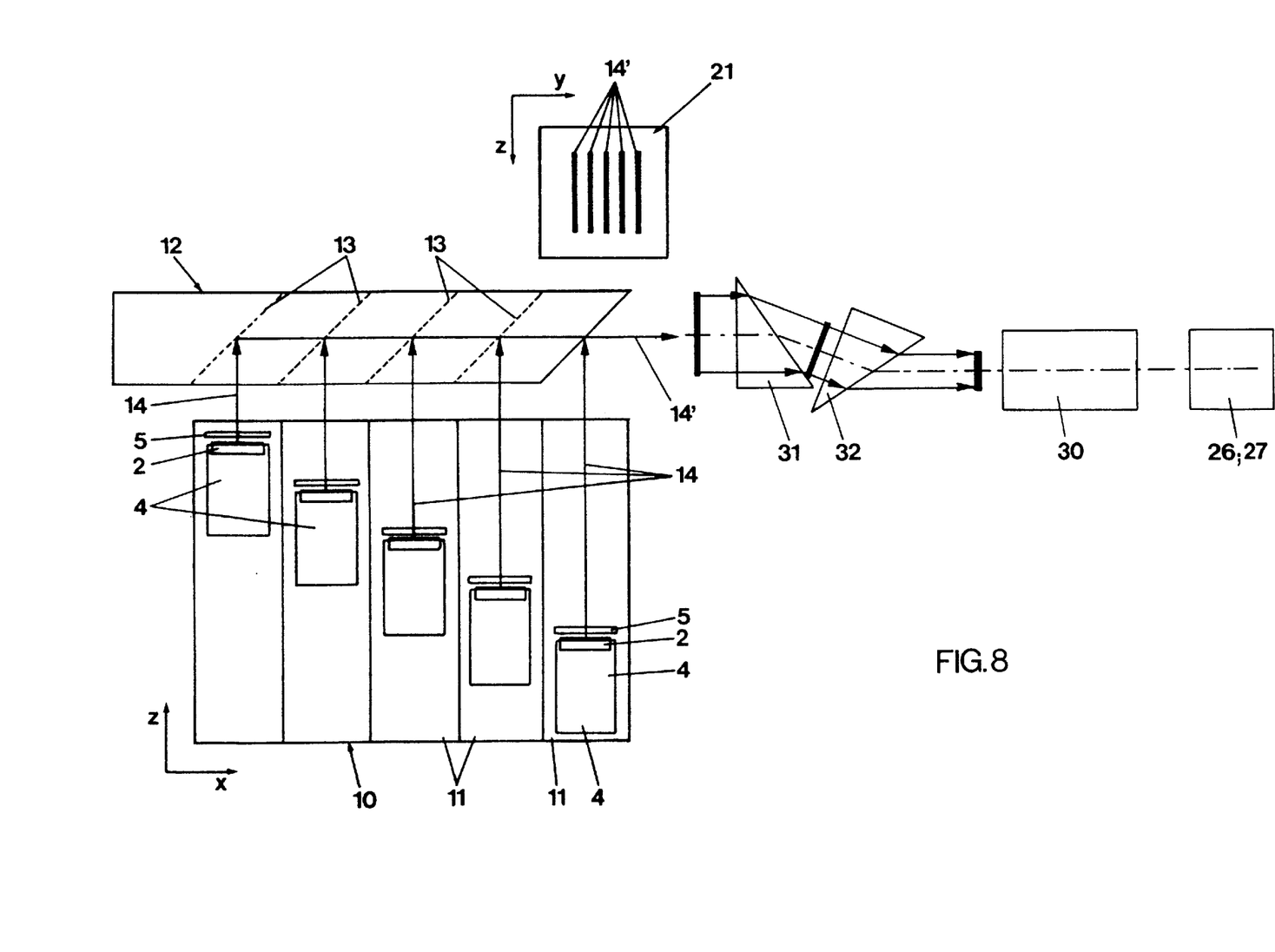
FIG. 8 illustrates a fourth version of the third embodiment similar to the version illustrated in FIG. 7 except that a prism has been introduced into the path of the radiation.

It will be evident from the foregoing that areas of illumination of any dimensions can be constructed from radiation deriving from individual diode-laser strips of the species specified herein with a stair-like displacement for each emitting laser. To project and focus a specific radiation component on its associated mirror subsequent to at least one reflection will of course require cylindrical and concave lens of the right dimension, which will in turn make the optical system more expensive. To keep the device as compact and inexpensive as possible, the version illustrated in FIG. 8 accordingly includes a prism or series of prisms 31 and 32. The beam entering prism 31 emerges narrower from prism 32. Another advantage of using two prisms as illustrated in FIG. 8 is that the emerging beam will parallel the entering beam. Prisms 31 and 32 also make it possible to vary the dimensions of radiation deriving from a particular strip 2 in the slow direction.

Figure 9:
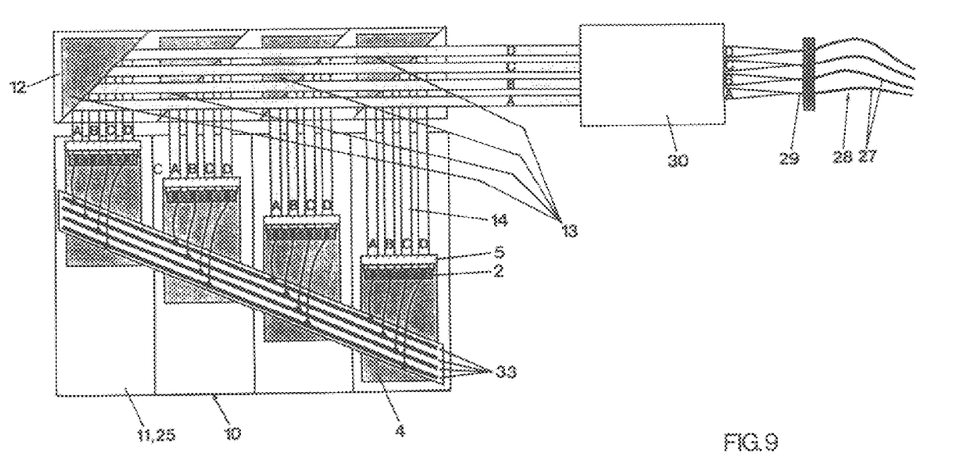
FIG. 9 illustrates a fifth version of the third embodiment similar to the version illustrated in FIG. 6 but wherein the different combinations of strips can be actively addressed in order to control the generated field of illumination on line.

Many applications require diode-laser strips with actively addressable emitter groups. Actively addressable strips are strips with emitters or emitter groups provided as illustrated in FIG. 9 with their own individual power-or-signal lines 33 such that they can be separately controlled. The output of each groups can be increased by optically stacking them. The associated emitters or emitter groups A, B, C, and D departing from a particular strip 2 can then be introduced into a specific optical fiber 27 or focused on the material being processed by a radiation shaping-and-focusing system 30. If the associated emitters or emitter groups are electrically interconnected as illustrated, the result will be an array or light guides with individually controlled outputs. This feature is particularly significant in parallel processing. The version illustrated in FIG. 9 is a variation of those illustrated in FIGS. 4 through 8. The four strips 2, each comprising emitter groups, can be controlled to ensure that the radiation can be assigned to any group A, B, C, or D downstream of radiation shaping-and-focusing system 30. Another advantage of controlling each channel A, B, C, and D separately by way of lines 33 is that the redundancy and output of each can be individually increased and decreased. If for example a group of strips 2 associated with a particular channel fails, the output from the other groups or lasers associated with that channel can be increased in compensation.

It can be desirable to mount two or more individual diode-laser strips on the same level of a stairway-like support 10. When for example pairs of strips are mounted one above the other paralleling the Y axis on the same stair and the pairs on adjacent stairs are combined, four linear emergent beams will appear subsequent to reflection by the mirrors, which are displaced in the form of stairways. To increase the precision of both the level and the quality of the radiation it is of advantage to combine the radiation deriving from the pairs with a polarizing system 34 of the type illustrated in FIG. 10A. Here, two schematically represented diode-laser strips 2 are separated paralleling the Y axis, the distance exaggerated for purposes of illustration. Polarizing system 34 comprises a beam divider and a $\lambda$ quarter plate. Polarizing system 34 combines the two radiation components into a single beam. This can be done with a mirror like the mirror 12 or reflective surface 13 hereintofore specified. The advantage of this approach is that the components can be combined without significant loss of output.

FIG. 10B illustrates another version that operates like the one illustrated in FIG. 10A. Two groups, each consisting of a single pair of strips 2 emitting the same wavelength are employed with a single polarizing system 34 and displaced paralleling the Y axis. Such a system is comparable to the positioning of individual strips 2 on a support 10 illustrate in FIG. 1 for example. The separate radiation component are combined into beams by deflecting mirrors 35.

Since, diode lasers of the same wavelength are usually employed on the same level in devices of the genus hereintofore specified, the emerging radiation is essentially composed of components derived from lasers emitting the same wavelength.

The components of two adjacent groups with two different wavelengths $\lambda_1$ and $\lambda_2$, and mounted in pairs can, however, be combined by a polarizing system 34 in the version illustrated in FIG. 10C, and superimposed by a dichroic component 36 when the wavelengths differ.

There has thus been shown and described a novel device for providing the cross-section of the radiation emitted by several solid-state and/or semiconductor diode laser with a specific geometry which fulfills all the objects and advantages sought therefor. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention, which is to be limited only by the claims which follow.

What is claimed is:

1. In a device for providing the radiation emitted by several solid-state and/or semiconductor diode lasers and especially by arrays of such lasers, with several lasers and/or arrays, with a specific geometry, whereby the lasers' individual radiation-emitting openings parallel the X-Y plane and their beams radiate parallel to the Z plane of a rectangular coordinate system, with an optical system that defines an area of illumination and includes mutually displaced reflectors, whereby at least one reflector is associated with each laser or array, and whereby the radiation from each laser or array is forwarded to the reflectors and reflected from them, the improvement wherein each laser or array is displaced in relation to its neighboring laser or array parallel to both the X and the Y axes and wherein the reflective surfaces of the reflectors are disposed in planes displaced and/or tilted such that the radiation components they reflect are mutually displaced perpendicular to the propagated radiation, paralleling the Z axis, in relation to the displacement of the radiation-emitting surfaces.

2. Device as defined in claim 1, wherein the diodes are displaced in sequence.

3. Device as defined in claim 2, wherein the reflective surfaces are positioned at different distances from their associated radiation-emitting openings.

4. Device as defined in claim 1, further comprising another reflective component next to the first, associated with a particular component of the radiation from a particular diode, and displaced from the first such that the various distances will match when the various components of the radiation are combined.

5. Device as defined in claim 1, wherein all the displacements and increments of distance to adjacent reflective surfaces are equal.

6. Device as defined in claim 1, wherein the reflective surfaces of the reflective components constitute a stairway-like mirror.

7. Device as defined in claim 1, wherein the reflective surfaces are flat.

8. Device as defined in claim 1, wherein the diodes or arrays are mutually displaced parallel to the Z axis.

9. Device as defined in claim 8, wherein the lasers or arrays are mutually displaced paralleling the Z axis.

10. Device as defined in claim 8, wherein the displacement of the lasers or arrays is sequentially coordinated with the displacement reflective components.

11. Device as defined in claim 10, wherein the displacement of the lasers or arrays is coordinated with that of the reflective components such that the radiation travels equal distances to a surface of emergence downstream of the reflective components and perpendicular to the radiation's direction of propagation.

12. Device as defined in claim 8, wherein the lasers or arrays are mounted on a stairway-like support with risers associated with the lasers or arrays.

13. Device as defined in claim 12, wherein the individual diodes or arrays radiate paralleling the stairs.

14. Device as defined in claim 12, wherein the radiation components are focused on a plane downstream of the reflective components and introduced into at least one light guide that commences at the focal point.

15. Device as defined in claim 1, wherein each radiation component is associated with a specific light guide and introduced into it downstream of a reflective component.

16. Device as defined in claim 1, wherein the radiation from several diodes or arrays is combined by polarization or by the addition of wavelengths.

17. Device as defined in claim 1, wherein the lasers or arrays are combined into at least three groups and in that the radiation from each group is combined, whereby the output of each group is independent of that of the others.

18. Device as defined in claim 17, wherein a particular group comprising a laser or array is electrically connected to and optically combined with another group comprising a laser or array.

19. Device as defined in clam 17, wherein an overall output comprising radiation from two groups of lasers or arrays is introduced into a faser.

* * * * *